(12) United States Patent
Choi et al.

(10) Patent No.: US 12,081,186 B2
(45) Date of Patent: Sep. 3, 2024

(54) WAVE CONTROL APPARATUS USING ELASTIC MODULUS CHANGE OF THERMORESPONSIVE MATERIAL

(71) Applicant: Korea University Research and Business Foundation, Seoul (KR)

(72) Inventors: Won-Joon Choi, Seoul (KR); Sang-Jun Lee, Seoul (KR); Haun-Min Lee, Seoul (KR)

(73) Assignee: Korea University Research and Business Foundation, Seoul (KR)

(*) Notice: Subject to any disclaimer, the term of this patent is extended or adjusted under 35 U.S.C. 154(b) by 788 days.

(21) Appl. No.: 17/204,445

(22) Filed: Mar. 17, 2021

(65) Prior Publication Data
US 2021/0297053 A1    Sep. 23, 2021

(30) Foreign Application Priority Data
Mar. 18, 2020 (KR) .................. 10-2020-0032982

(51) Int. Cl.
*H03H 9/02* (2006.01)
*G10K 11/162* (2006.01)
*G10K 11/172* (2006.01)

(52) U.S. Cl.
CPC ......... *H03H 9/0211* (2013.01); *G10K 11/162* (2013.01); *G10K 11/172* (2013.01); *H03H 9/02062* (2013.01)

(58) Field of Classification Search
CPC .... H03H 9/0211; H03H 9/02062; H03H 9/25; H03H 9/02834; G10K 11/162; G10K 11/172
See application file for complete search history.

(56) References Cited

U.S. PATENT DOCUMENTS

| | | | |
|---|---|---|---|
| 2017/0227408 A1* | 8/2017 | Helvajian | B22F 10/38 |
| 2017/0340345 A1 | 11/2017 | Yates et al. | |
| 2018/0043473 A1* | 2/2018 | Helvajian | G01H 9/00 |
| 2018/0201713 A1 | 7/2018 | Iwasaki | |
| 2018/0374466 A1 | 12/2018 | Kim et al. | |

OTHER PUBLICATIONS

Yong Li et al., "Reflected wavefront manipulation based on ultrathin planar acoustic metasurfaces", Scientific Reports, Aug. 29, 2013, pp. 1-6, Cited in the specification.
Dylan Lu et al., "Hyperlenses and metalenses for far-field super-resolution imaging", Nature Communications, Nov. 13, 2012, pp. 1-9, Cited in the specification.
Guancong Ma et al., "Acoustic metasurface with hybrid resonances", Nature Materials, Jun. 1, 2014, pp. 873-878, Cited in the specification.

* cited by examiner

*Primary Examiner* — Emily P Pham
(74) *Attorney, Agent, or Firm* — Hauptman Ham, LLP (57) ABSTRACT

The present invention relates to a wave control apparatus using change of elastic modulus of thermoresponsive material, comprising: a wave modulation member having thermoresponsive material whose elastic modulus changes according to temperature variation, a wave source propagating wave through the wave modulation member, and a heating unit forming a wave modulation region by heating the wave modulation member, wherein the wave propagating through the wave modulation member from the wave source is configured to change wave characteristics when the wave passes through the wave modulation region heated by the heating unit.

14 Claims, 12 Drawing Sheets

WAVE CONTROL APPARATUS USING ELASTIC MODULUS CHANGE OF THERMORESPONSIVE MATERIAL

CROSS REFERENCE TO RELATED APPLICATION

The present application claims priority to Korean Patent Application No. 10-2020-0032982, filed Mar. 18, 2020, the entire contents of which is incorporated herein for all purposes by this reference.

DISCLOSURE

Technical Field

The present invention relates to a wave control apparatus using elastic modulus change of thermoresponsive material, in particular a wave control apparatus able to change wave characteristics such as ultrasonic wave using a thermoresponsive material such as thermoresponsive polymer.

BACKGROUND

The ultrasonic wave (UW), which is defined as the sound wave having frequency over 20 kHz, is inaudible to human sensory system and harmless to human bodies, thereby being a low-cost, safe and general technique applied to diverse engineering applications. This is why the ultrasonic wave is widely utilized not only in everyday lives but in various application fields ranging from medical imaging, in-display fingerprint sensors for smartphones, non-destructive testing, sound detection such as Sound Navigation and Ranging (SONAR) technology, and range control, etc.

The UWs propagating through solid media have higher travelling speed compared to airborne UWs and possess some important features that are utilized in industrial application fields. For example, the features include the ability of UWs to increase temperature of local point inside solid media by concentrating the wave energy, the reflection of waves when they meet the interface of disparate materials having different acoustic impedances, etc.

When it comes to UW-related technologies, there are some decisive factors that determine the overall performance of the apparatuses. These include the wavelength, waveform, or directionality of the UWs. The wavelength regulates the resolution of the UW sensory or imaging platforms, while the waveform and the directionality of the waves affect the range of UW effects.

For instance, the UWs used for medical diagnostic devices are limited to ones having frequency over 1 MHz since they have wavelengths and spatial resolutions of 1 mm inside water. Additionally, the design of UW transducers determines the waveforms and the sensing scopes. Since individual transducers are only capable of generating UWs having distinct frequency, waveform, or amplitudes, the methodological approaches to tune the UWs according to diverse needs have been hot issues for decades.

One of the most widely and intensively studied methods for this issue is designing acoustic metamaterials or metasurfaces. Design of acoustic metamaterials or metasurfaces was introduced in Lu, D. and Liu, Z. "Nature Communications 3, 1205, (2012)."; Ma, G., Yang, M., Xiao, S. Yang, Z.; Sheng, P. "Nature Materials 13, 873-878, (2014)."; Li, Y., Liang, B., Gu, Z.-m., Zou, X.-y. and Cheng, J.-c. "Scientific Reports 3, 2546, (2013)."

Design of acoustic metamaterials or metasurfaces corresponds to artificial structures that have the capability of controlling acoustic waves in the ways that are unlikely to happen in the nature. The examples include modulating the directionality of acoustic waves in unnatural ways that show the characteristic of refractive index, acoustic rectifier, or total reflecting interfaces.

Figure 1:
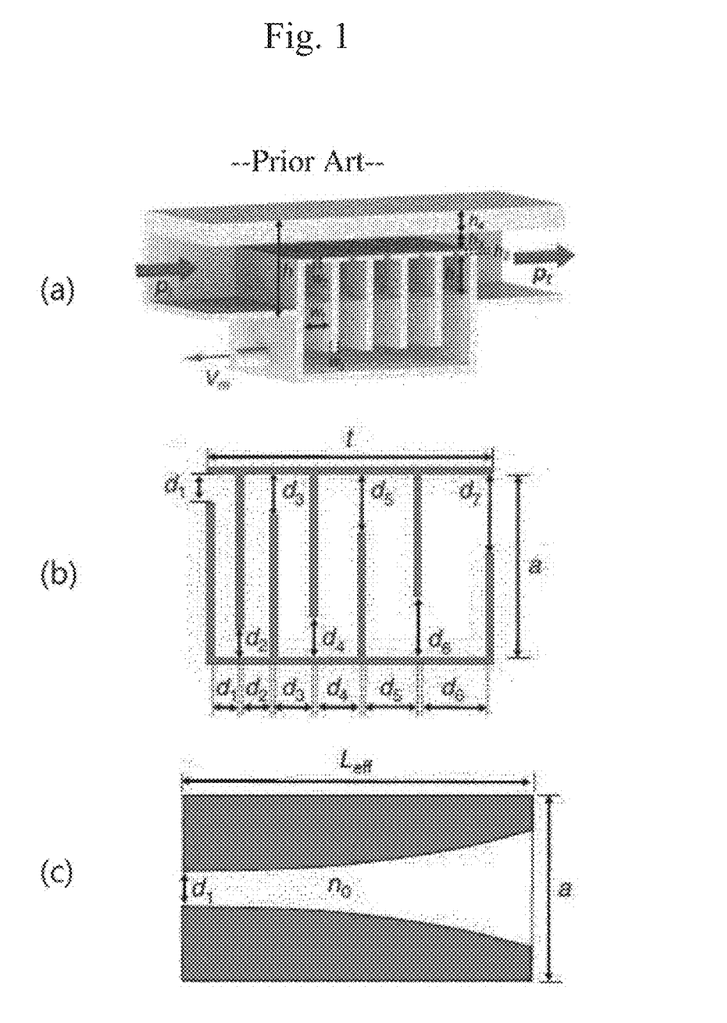
FIG. 1 shows an example of design of conventional acoustic metasurfaces.

FIG. 1 shows an example of a conventional design of acoustic metasurfaces. In case of metasurfaces, the controllability for acoustic waves are achieved by adopting the specially designed 2D geometries that induce the phase modulation or phase lag of the waves at intended points.

The complex and small geometries required for the metasurfaces, however, limit the applicability of this method for versatile UW modulations. This is because the metasurface unit geometries having particular scales are only applicable to waves having specific wavelength (or frequency) ranges. Furthermore, advanced manufacturing technologies like 3D printing or laser cutting are required to fabricate the high-resolution metasurface units, limiting the wide applications. More versatile methods to engineer the UWs without the need for complex designs are required to tune the waves having wide frequency ranges than conventional metasurface technologies can do.

TECHNICAL PROBLEMS TO BE SOLVED

Accordingly, the present invention is provided to solve the above problems and an object of the present invention is to overcome the disadvantages of the metasurfaces and to provide a wave control apparatus which controls characteristics such as wavelength, waveform and traveling velocity of wave using the same wave source without changing physical structure or shape of medium.

Further, another object is to provide a wave control apparatus which is able to change a geometric shape of heating region in the medium for controlling wave into a desired shape, thereby reducing the time and cost for purchasing an additional wave source or designing and manufacturing a new medium.

TECHNICAL SOLUTION

The above object is accomplished by a wave control apparatus using change of elastic modulus of thermoresponsive material, comprising: a wave modulation member having thermoresponsive material whose elastic modulus changes according to temperature variation, a wave source propagating wave through the wave modulation member, and a heating unit forming a wave modulation region by heating the wave modulation member, wherein the wave propagating through the wave modulation member from the wave source is configured to change wave characteristics when the wave passes through the wave modulation region heated by the heating unit.

Here, the wave may comprise wave which is able to pass through a solid surface of solid.

Also, the wave may comprise any one of ultrasonic wave, surface wave and seismic wave.

Also, the thermoresponsive material may comprise thermoresponsive polymer.

Also, the thermoresponsive polymer may comprise any one of Nylon, Polyethylene (PE), Polyethylene terephthalate (PET), Polytetrafluoroethylene (PTFE), and Isotactic polypropylene (PP).

Also, the heating unit may be configured to form the wave modulation region by selectively heating a portion of the wave modulation member and to change wave characteristics by changing a geometric shape of the wave modulation region.

Also, the heating unit may have a plate shape which is formed along a plate surface of the wave modulation member; the heating unit having a plate shape may consist of a plurality of unit heating cells which are heated respectively; and the wave control apparatus may further comprise a wave control unit which controls the heating unit such that at least one of the plurality of unit heating cells is selectively heated and the unit heating cells which are selectively heated form the wave modulation region.

Also, the unit heating cells may have any one of a square shape, a right-angled triangle shape and a honeycomb shape.

Also, the wave control unit may be configured to selectively heat at least one of the plurality of unit heating cells to control geometric shape of the wave modulation region, thereby changing characteristics of wave passing through the wave modulation region.

Also, the wave modulation region may comprise an incidence plane which wave enters and an exit plane from which wave exits; and characteristics of wave coming out from the exit plane change according to a combination of geometric shapes of the incidence plane and the exit plane.

Also, the wave control unit may be configured to make the wave source generate a circular wave and to control the heating unit such that the incidence plane forms a V shape or an arc shape towards a traveling direction of the circular wave, thereby changing the circular wave passing through the incident wave into a planar wave.

Also, the wave control unit may be configured to control the heating unit such that an angle of the exit plane with respect to a traveling direction of a planar wave which is changed by the incidence plane or enters the incidence plane, thereby controlling the traveling direction of the planar wave passing through the exit plane.

Also, the wave control unit may be configured to control the heating unit such that the exit plane forms a V shape towards a traveling direction of a planar wave which is changed by the incidence plane or enters the incidence plane, thereby bifurcating the planar wave passing through the exit plane in the travelling direction.

Also, the wave control unit may be configured to control the heating unit such that the wave modulation region has a circular shape, thereby concentrating the planar wave from the wave source on an outside of the exit plane.

Also, the wave control unit may be configured to control wavelength of the wave passing through the wave modulation region by controlling temperature of the wave modulation region.

Also, the wave control unit may be configured to control the heating unit such that the wave modulation region is heated up to temperature within a glass transition of the thermoresponsive material or temperature selected within temperature range above the glass transition.

EFFECTS

According to the above aspects of the present invention, it is possible to provide a wave control apparatus which overcomes the disadvantages of the metasurfaces and which controls characteristics such as wavelength, waveform and traveling velocity of wave using the same wave source without changing physical structure or shape of medium.

Further, it is possible to provide a wave control apparatus which is able to change a shape of medium for controlling wave into a desired shape, thereby reducing the time and cost for purchasing an additional wave source or designing and manufacturing a new medium.

Further, it is possible to control wave passing through the wave modulation member by controlling a geometric shape in the wave modulation region of the wave modulation member and a heating temperature.

Further, if the heating of the heating unit is stopped, temperature of the wave modulation region in the wave modulation member returns to the initial state. Therefore, medium used for the wave control can be re-used for another purpose.

MODE FOR INVENTION

Advantages and features of the present invention and methods for accomplishing them will be clearly understood with reference to the accompanying drawings and embodiments described below. However, the present invention is not limited to the embodiments disclosed hereinafter, but can be embodied in various forms. Embodiments are merely provided to complete the disclosure of the present invention and to let those skilled in the art know the scope of the invention. The present invention is defined by the claims only. In the whole specification, the same reference number indicates the same element.

Figure 2:
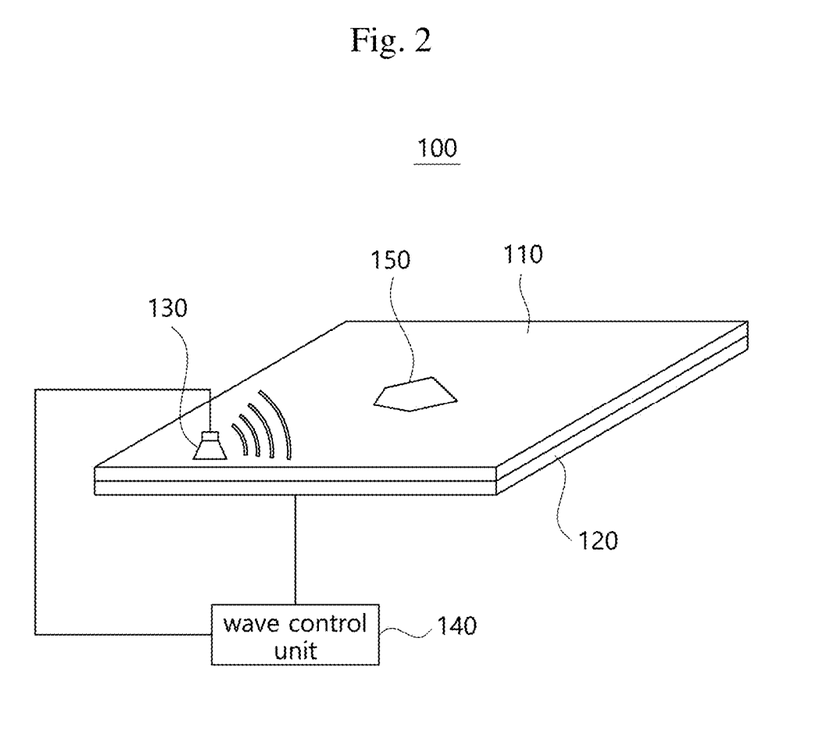
FIG. 2 shows a wave control apparatus according to an embodiment of the present invention.

The wave control apparatus according to an embodiment of the present invention controls wave using the change of elastic modulus of thermoresponsive material. FIG. 2 shows a wave control apparatus according to an embodiment of the present invention. Referring to FIG. 2, the wave control apparatus according to the embodiment of the present invention comprises a wave modulation member 110, a wave source 130, a heating unit 120 and a wave control unit 140.

The wave modulation member 110 has thermoresponsive material whose elastic modulus changes according to temperature variation. For example, the thermoresponsive material includes thermoresponsive polymer and nylon such as Nylon 6 is used as the thermoresponsive polymer.

The wave source 130 propagates wave through the wave modulation member 110. In the present invention, for example, wave propagating from the wave source 130 is ultrasonic wave.

The heating unit 120 heats the wave modulation member 110 to generate a wave modulation region 150. As such, wave such as ultrasonic wave as described above (hereinafter will be explained using ultrasonic wave) propagating from wave source 130 via the wave modulation member 110 passes through the wave modulation region 150 which is heated by means of the heating unit 120, resulting in that characteristics of wave such as wavelength, waveform, or directionality will change.

Here, for example, the heating unit 120 selectively heats a portion of the wave modulation member 110 to generate a wave modulation region 150. In this regard, the heating unit 120 selectively heats a portion of the wave modulation member 110 and modifies geometries of the wave modulation region 150 to change characteristics of wave.

Hereinafter, Nylon 6 is used and it will be described that characteristics of ultrasonic wave change when ultrasonic wave passes through the wave modulation region 150 formed on the wave modulation member 110 by heating the wave modulation member 110 partially.

Figure 3:
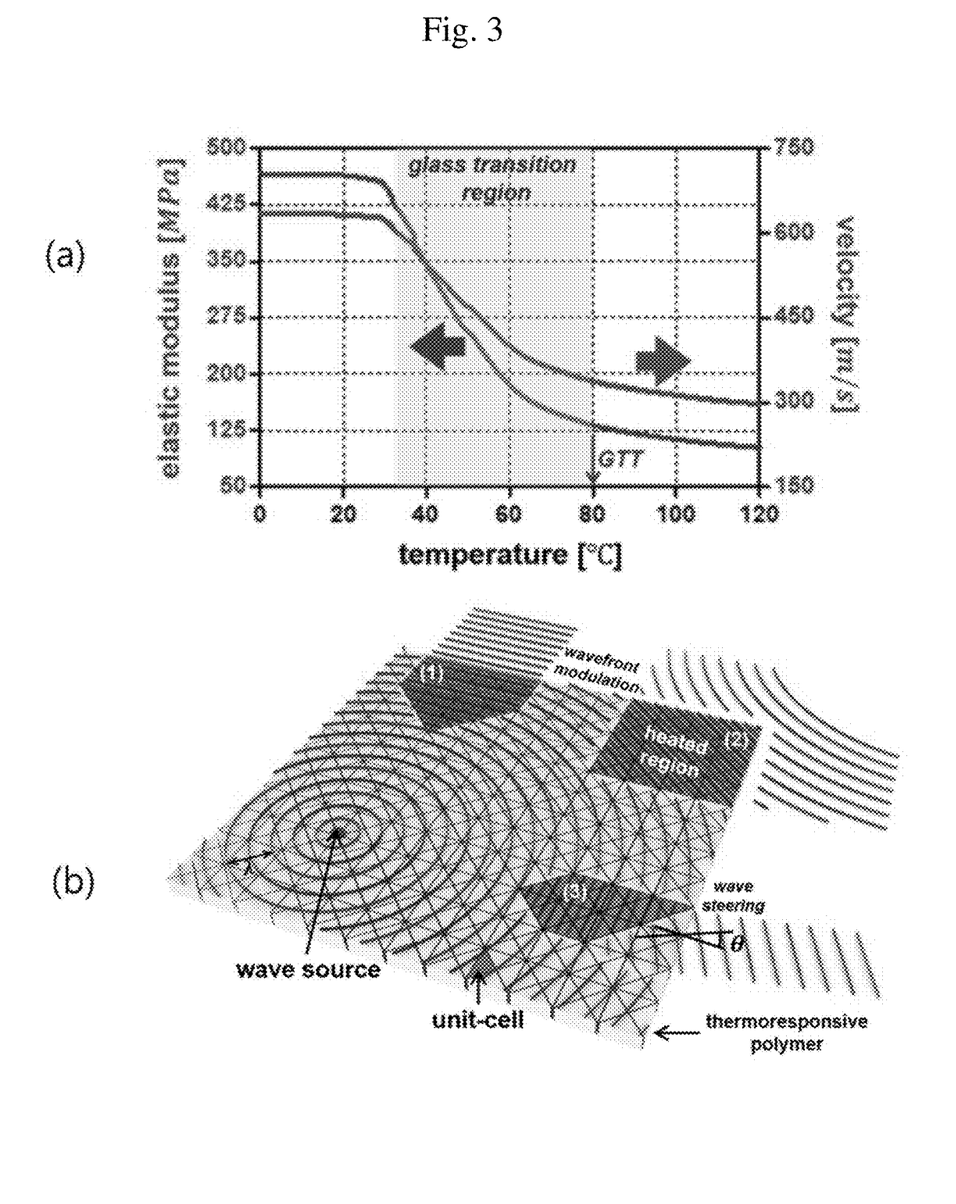
FIGS. 3 and 4 explain an operation of the wave control apparatus according to an embodiment of the present invention.

FIG. 3 (a) shows thermoresponsive elastic modulus of Nylon 6 at 0° C. to 120° C. and corresponding ultrasonic velocity. It is noted that the elastic modulus and the velocity of ultrasonic wave decrease abruptly until it reaches a plateau after the glass transition temperature (GTT).

If Nylon 6 is heated up to reach a predetermined temperature, the bulk modulus of Nylon 6 decreases abruptly until Nylon 6 reaches a low plateau value. The temperature range when the bulk modulus is between the highest and the lowest plateau values is called glass transition region, and the temperature at which the lowest plateau value of bulk modulus begins is termed as the glass transition temperature. The glass transition temperature values vary depending on the type of thermoresponsive polymer and has the range from 0° C. to 300° C.

The decrease of the bulk modulus of thermoresponsive polymer such as Nylon 6 as the temperature rises is not a special property of thermoresponsive polymer since metals also show linearly decreasing modulus values when heated up. However, thermoresponsive polymer has features representing a step-like function having a steep decrease of bulk modulus inside the glass transition region. Also, the glass transition region of thermoresponsive polymer normally does not exceed over 1000° C.

This exceptional property of thermoresponsive polymers originates from the fact that chemical structures of thermoresponsive polymers undergo shifts between glassy state and rubbery state. The drastic shift of thermoresponsive polymer structures between the two states generates an interface between the wave modulation region 150 which is heated on the wave modulation member 110 made of thermoresponsive polymer and other region.

The velocity of acoustic waves propagating through a solid medium is defined as $v=\sqrt{B/\rho}$ and here B is a bulk modulus and $\rho$ is a density of the medium. The bulk modulus of a solid material can be expressed as $B=E/3(1-2v)$ and here, E is elastic modulus and V is a Poisson's ratio. In case that the Nylon 6 polymer is about 0.33, the bulk modulus shows a value which is almost identical to elastic modulus. In case of many other polymers, since the Poisson's ratio is in the range between 0.3 and 0.4, it can be reasonably inferred that $B \approx E$. This means $v \approx \sqrt{E/\rho}$ for most of thermoresonsive polymer materials. The changing aspect of elastic modulus of Nylon 6 and corresponding acoustic wave velocity is shown in FIG. 3(a). The upper and lower plateau values for elastic moduli are 467 Pa and 99.4 Pa, respectively and the glass transition temperature is about 80° C. The elastic modulus drops by 78% as the temperature is raised up above the glass transition temperature, which indicates that the velocity V of the acoustic wave passing through Nylon 6 drops.

FIG. 3(b) shows a concept of an operation of the wave control apparatus according to the present invention. When the circularly propagating ultrasonic wave passing through Nylon 6, i.e., the wave modulation member 110 of the present invention meets a local region heated up to glass transition temperature, i.e., wave modulation region 150, characteristics such as wavelength, waveform, and directionality of ultrasonic wave passing through the wave modulation region 150 are changed.

This is because the wave modulation region 150 which is a heated region has substantially lower elastic modulus than a non-heated region, resulting in the alteration of the wave propagation speed in that part ($v \approx \sqrt{E/\rho}$). It is widely known that when acoustic waves pass through the interface between two media with different refractive indices ($n_1$ and $n_2$), the wave undergoes refraction of directionality governed by $n_1 \sin \theta_1 = n_2 \sin \theta_2$, when $\theta_1$ is incident angle and $\theta_2$ is refractive angle at the interface. From the definition of relative refractive index $n_i = 1/v_i$, when $v_i$ denotes the acoustic wave propagation velocity inside the ith medium, the conventional Snell's law can be rewritten as $\sin \theta_1/v_1 = \sin \theta_2/v_2$. This means that as shown in FIG. 3(b), the drastic change of wave propagation velocity inside a medium can induce the propagating direction to be altered by the refraction, and accordingly the wave control apparatus 100 of the present invention controls the direction of wave. Likewise, in addition to the direction control, the wave control apparatus 100 of the present invention is able to control total reflection, focusing, or bifurcation, which will be explained later.

Advantageously, the wave control apparatus 100 of the present invention can control wave inside a single propagation medium, i.e., inside the wave modulation member 110, unlike the conventional platforms that waves meet the interface of two different materials.

Unwanted wave distortion or attenuation can be induced at the point where dissimilar media meet as a result of the imperfect adhesion between different media. However, the wave modulation member 110 of the wave control apparatus 100 of the present invention has a wave modulation region 150 which is a heated region inside a single thermoresponsive material, e.g., a thermoresponsive polymer such as Nylon 6, thereby providing effects of removing problems caused by the interface between different media.

Figure 4:
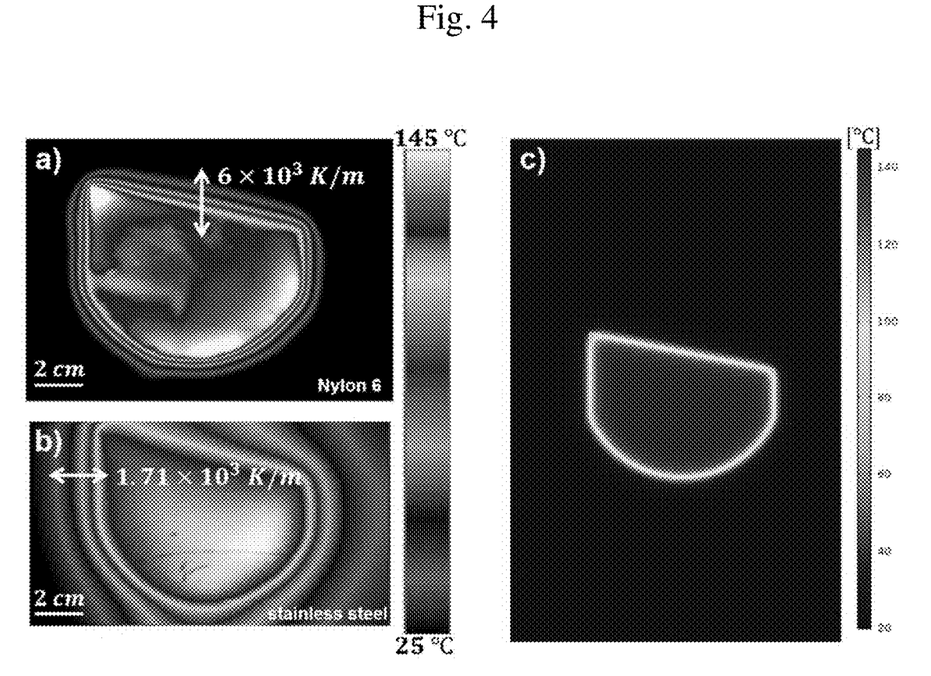

Furthermore, acoustic waves such as ultrasonic wave are not only refracted but also reflected at the interface between two different media having different acoustic impedance $Z = \beta V$. This may cause the interference between incident and reflective waves, resulting in unwanted waveform transformation. Meanwhile, like the wave control apparatus 100 of the present invention, in case of the wave control inside a single medium, there is no interface in which a discrepancy of acoustic impedances occurs, thereby providing effects of removing the above problem. This is because the temperature gradient of the wave modulation member 110 which is a single medium is generated as shown in FIG. 4 and therefore the wave propagation velocity experiences a continuous change inside a heated region. The smooth change of the velocity V inside a certain thickness induces continuous change of Z and results in no clear reflection of incident waves.

FIG. 4(a) indicates the formation of precipitous temperature gradient of $6 \times 10^3$ K/m when 2D Nylon 6 plate (thickness=0.5 mm) is heated up to 145° C. This exceptionally precipitous temperature gradient on Nylon 6 plate is compared with a metal plate (stainless steel, $1.71 \times 10^3$ K/m) having the same thickness heated up to the same temperature as shown in FIG. 4 (b). The difference of temperature gradient between Nylon 6 and stainless steel originates from the thermal conductivity difference and Nylon 6 has substantially low thermal conductivity difference of 0.24-0.28 W/m·K compared to stainless steel whose thermal conductivity is 16.26 W/m·K.

These features solve the above problems caused by the acoustic impedance difference and also maintain distinct contour of a geometric shape of the wave modulation region when the wave modulation region is formed by the local heating of the wave modulation member, thereby it being possible to control the desired wave.

Figure 5:
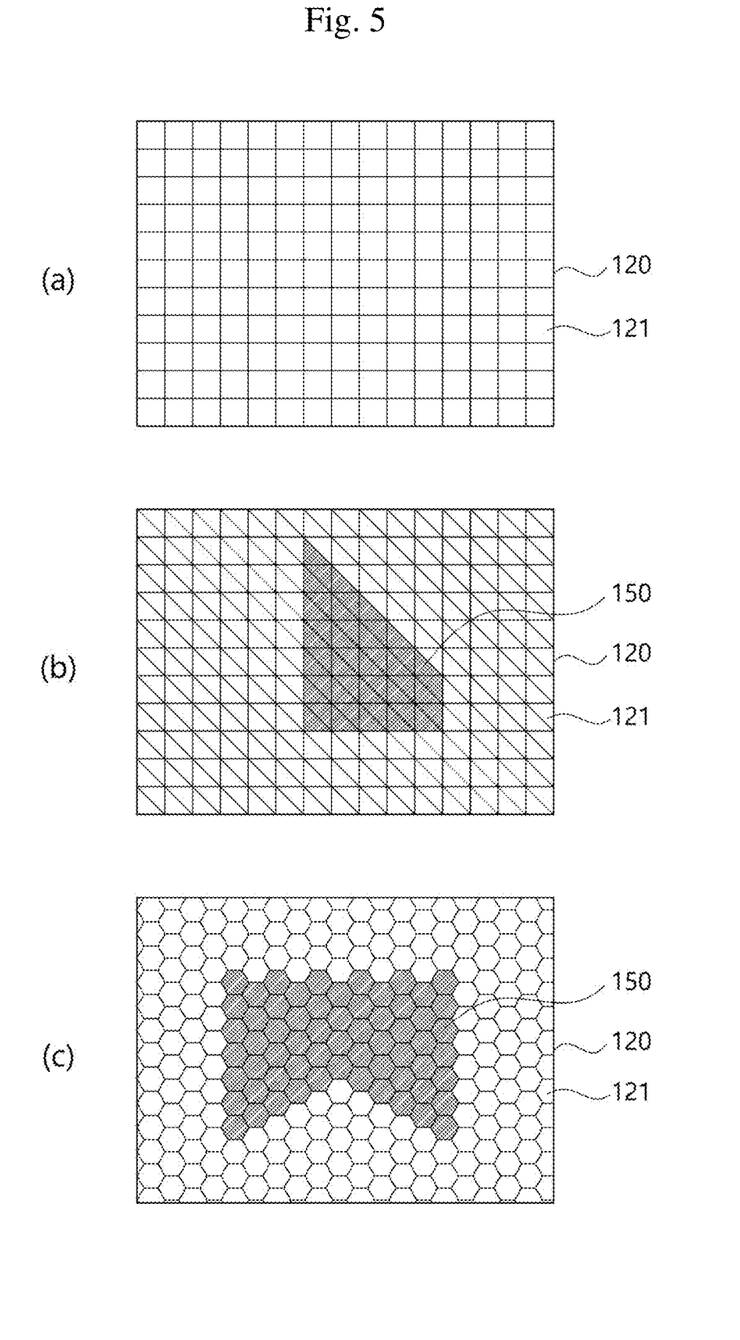
FIG. 5 shows examples of heating units of the wave control apparatus according to an embodiment of the present invention.

FIG. 5 shows examples of heating units 120 of the wave control apparatus 100 according to an embodiment of the present invention. According to the examples in FIG. 5, it is shown that an area of the wave modulation region 150 is selectively heated and a geometric shape of the wave modulation region 150 is modulated, thereby modulating wave characteristics.

As shown in FIGS. 1 and 5, the heating unit 120 has a shape of a plate which is formed along a plate surface of the wave modulation member 110. As shown in FIG. 5, the heating unit 120 consists of a plurality of unit heating cells 121 which are heated respectively.

Here, the wave control unit 140 controls the heating unit 120 in such a manner that some of the plurality of unit heating cells 121 are heated, and the unit heating cells 121 which are heated selectively generate the wave modulation region 150 and therefore, it is possible to change the geometric shape of the wave modulation region 150 by selecting the unit heating cell 121 to be heated.

FIG. 5 (a) is an example showing that the unit heating cell 121 has a square shape, FIG. 5 (b) is an example showing that the unit heating cell 121 has a right-angled triangle shape, and FIG. 5 (c) is an example showing that the unit heating cell 121 has a honeycomb shape. As shown in FIGS. 5 (b) and (c), wave modulation regions 150 having different geometric shape are formed by selecting cells to be heated among the plurality of unit heating cells 121.

Meanwhile, the wave modulation region 150 may comprise an incidence plane into which wave enters and an exit plane from which wave exits. The incidence plane and the exit plane form an interface with regard to a non-heated region of the wave modulation member 110, i.e., the above described interface and the change of wave characteristics occurs at the interface.

FIGS. 6 to 10 show simulation results to provide effects of the wave control apparatus 100 according to the present invention.

Figure 6:
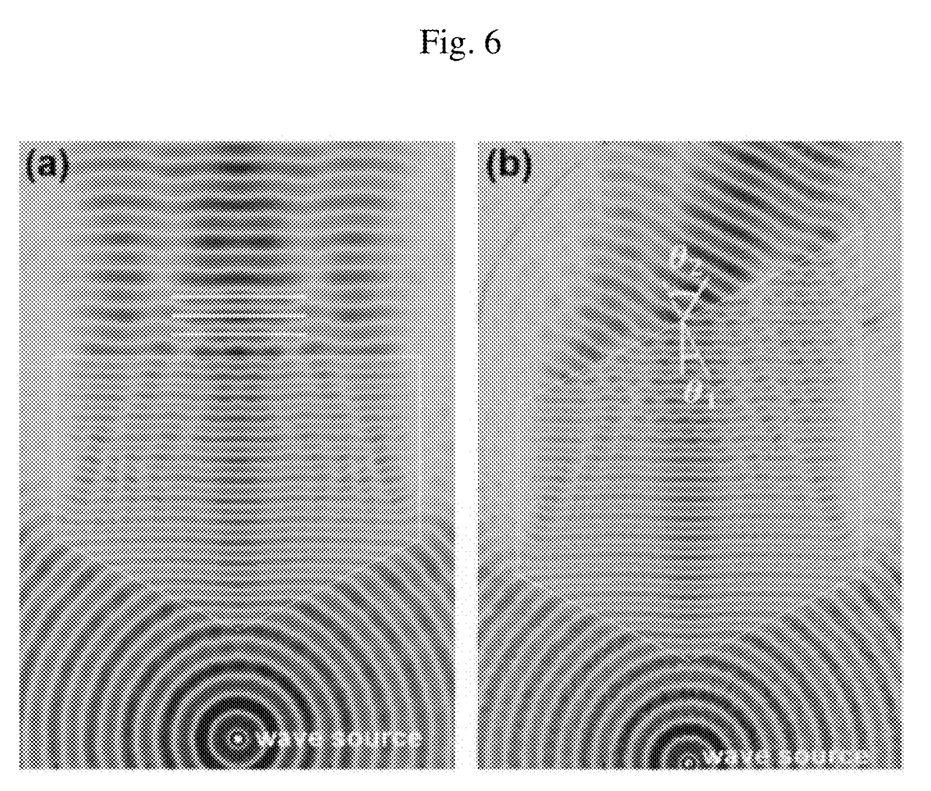
FIGS. 6 to 10 show simulation results to explain effects of the wave control apparatus according to the present invention.

FIG. 6 represents a simulation result based on the use of Nylon 6 plate and the heating unit 120 having the structure of the unit heating cells 121 shown in FIG. 5 (b) was applied. The boundary represented by a white colored solid line indicates a wave modulation region 150. The simulation was performed using pressure acoustics of Comsol Multiphysics v5.2. Wave propagating from the wave source 130 is an ultrasonic wave of 40 kHz which is a circular wave. In the figure, red color and blue color indicate an acoustic pressure.

As shown in FIG. 6(a), in a state that the wave source 130 is controlled to generate a circular wave, if the wave control unit 140 controls the heating unit 120 such that the incidence plane of the wave modulation region 150 forms a V shape towards the traveling direction of the circular wave, it can be seen that the circular wave passing through the incidence plane changes into a planar wave. The planar wave which is changed when it passes through the incidence plane moves towards the exit plane via the wave modulation region 150.

Here, if the exit plane is perpendicular to the traveling direction of the planar wave, the planar wave is maintained when it passes through the exit plane as shown in FIG. 6(a). But, a change of wavelength occurs when the wave passes through the incidence plane and the exit plane.

Meanwhile, as shown in FIG. 6(b), if the exit plane is at an angle with regard to the traveling direction of the planar wave, the traveling direction of the planar wave passing through the exit plane can be controlled. Here, a deflecting angle of the planar wave passing through the exit plane, i.e., a refractive angle $\theta_2$, is controlled according to the angle of the exit plane with respect to the travelling direction of the planar wave.

Here, if the wave propagation velocity inside the wave modulation region 150 is $v_1$ and the wave propagation velocity outside the wave modulation region 150 is $v_2$, the refractive angle $\theta_2$ can be controlled according to Snell's law. This can be rewritten as $\theta_2 = \sin^{-1}[(v_2/v_1)\sin\theta_1]$.

Here, $v_1$ can be controlled by controlling the modulus inside the wave modulation region 150 by means of $v_1 \approx \sqrt{E/\rho}$ and the angle $\theta_1$ of the exit plane can be controlled by controlling the geometric shape of the wave modulation region 150, which enables the refractive angle $\theta_2$ to be controlled.

Figure 7:
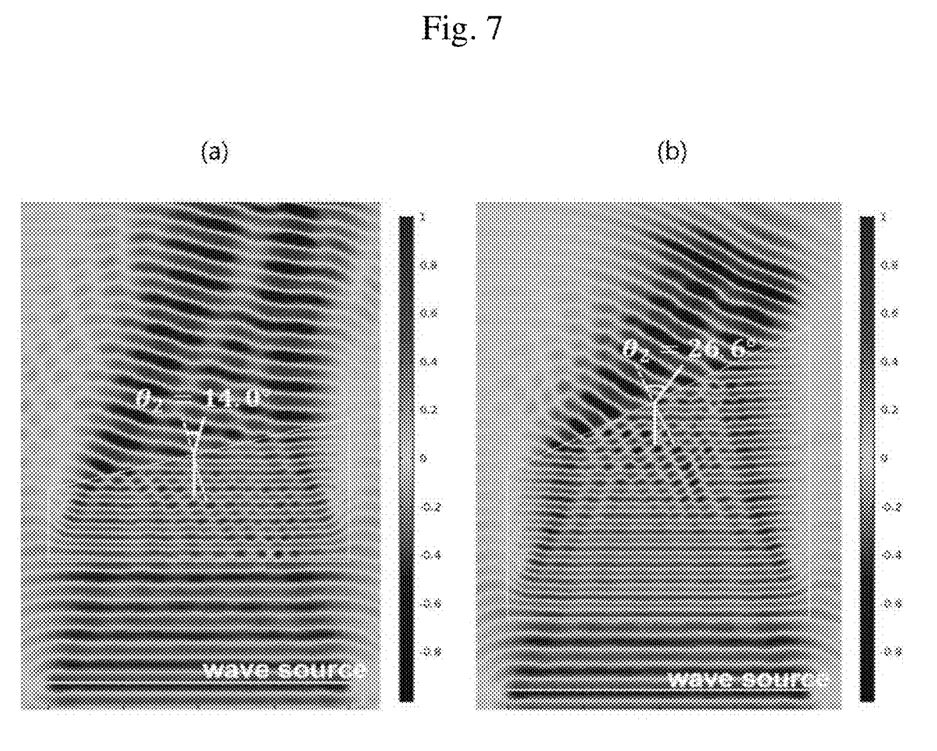

In more detail, referring to FIG. 7, since the wave modulation region 150 has the same temperature and modulus, the refractive angle $\theta_2$ can be controlled by controlling the angle $\theta_1$ of the exit plane which is a geometric shape of the wave modulation region 150. Regarding the formula $\theta_2 = \sin^{-1}[(v_2/v_1)\sin\theta_1]$, if $v_1$ and $v_2$ are fixed, $\theta_2$ can be controlled by the control of $\theta_1$. FIG. 7(a) represents an example of simulation wherein $\theta_1$ is controlled such that $\theta_2$ becomes 14.00 and FIG. 7(b) represents an example of simulation wherein $\theta_1$ is controlled such that $\theta_2$ becomes 26.6°. Embodiments of FIG. 7 show simulation results of an example that a planar wave enters the incidence plane from the wave source 130.

The increase of $\theta_1$ causes $\theta_2$ to increase accordingly. A critical value is defined by the angle of $\theta_1$ When $\theta_2$ reaches 90° and the critical value depends on the type of thermoresponsive material applied to the wave modulation member 110 and characteristics of incident wave. In the above simulation, the critical value is 33°.

Figure 8:
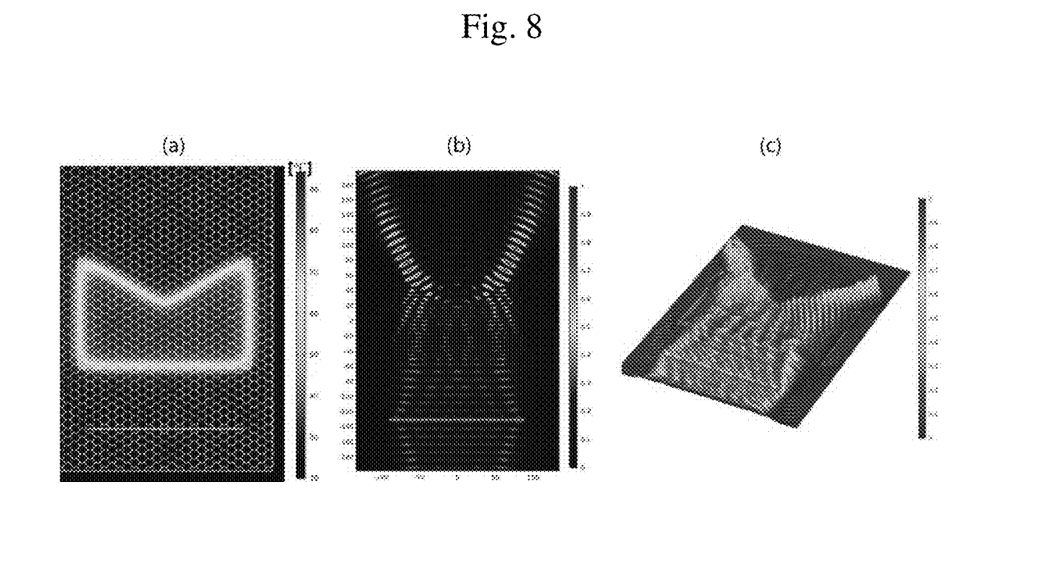

FIG. 8 shows a simulation result when the heating unit 120 consisting of unit heating cells 121 having a hexagon shape, i.e., a honeycomb shape is applied. The unit heating cells 121 has sides each of which has a length set to be 6 mm. It is advantageous that the unit heating cells 121 having a honeycomb shape can be arranged densely in the whole area without empty space or without waste of space.

FIG. 8(a) shows an example that the wave modulation region 150 is formed such that the exit plane has a V shape towards the traveling direction of the wave. The incidence plane is perpendicular to the traveling direction of the wave and it can be seen that the planar wave enters from the wave source 130 as shown in FIG. 8(b).

If the planar wave enters the wave modulation region 150 through the incidence plane, the wave travels towards the exit plane as it maintains the shape of a planar wave and then it is bifurcated at the exit plane having the V shape. As shown in FIG. 8(c), an intensity of each bifurcated wave is shown three dimensionally and it can be seen that wave having high intensity is bifurcated. Here, it can be seen that the bifurcated angle can be controlled by the control of the angle of a V shaped exit plane as shown in FIGS. 6 and 7.

Figure 9:
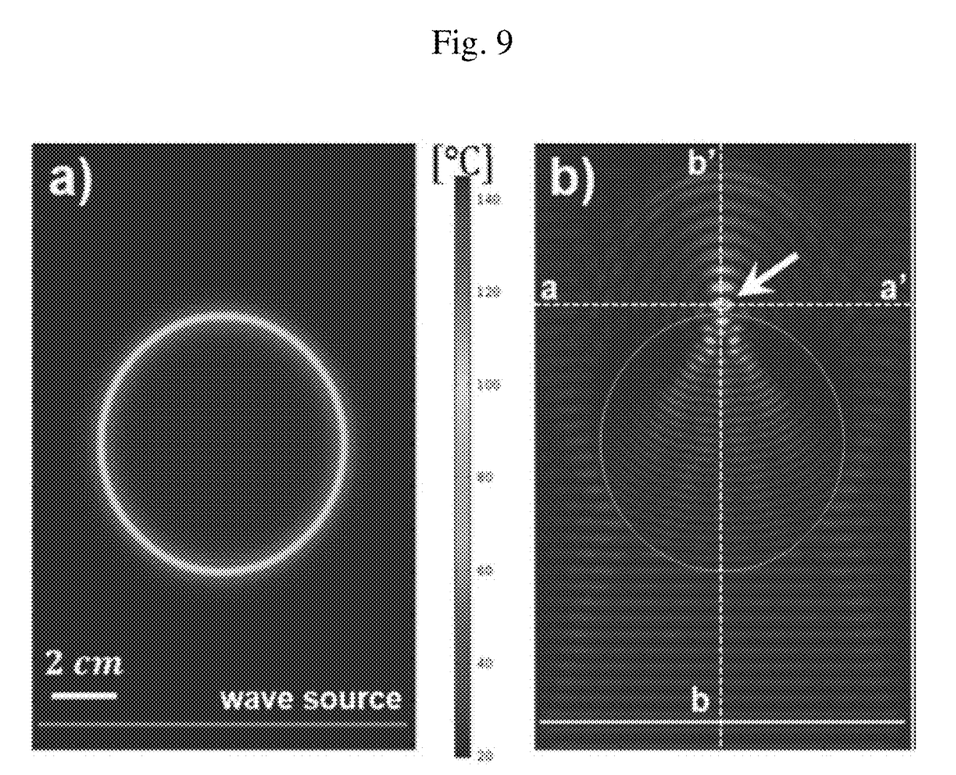
Figure 10:
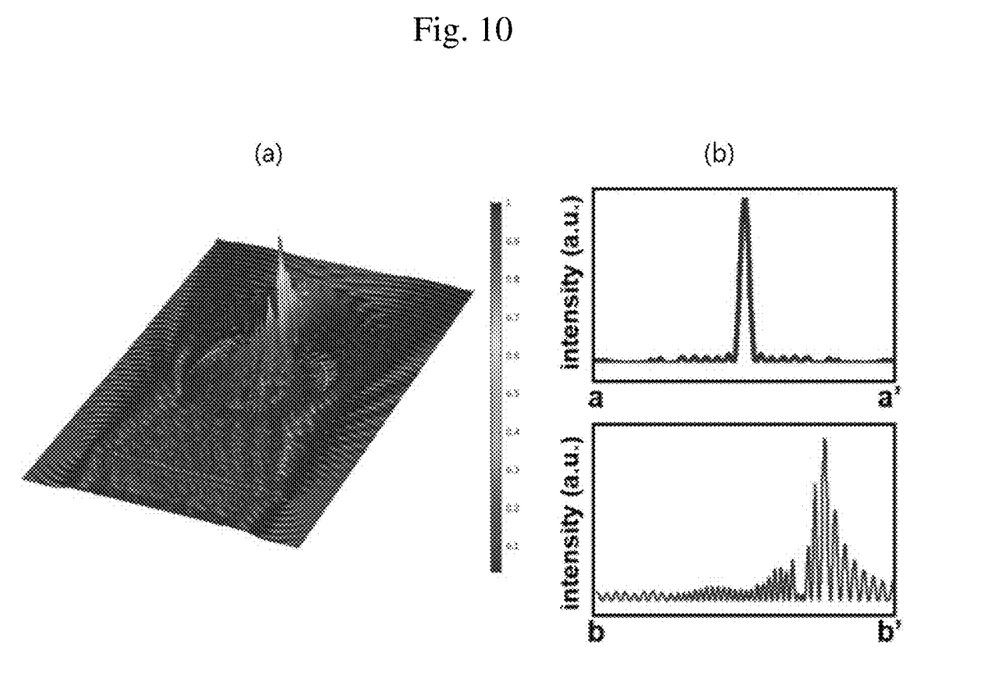

FIGS. 9 and 10 show simulation results when the wave modulation region 150 has a circular shape.

According to the simulation, the wave modulation region 150 is heated up to 140° C. and it can be seen that if the planar wave enters the circular wave modulation region 150, the concentration of the wave is induced at a point near the outside of the exit plane. FIG. 10(*a*) shows an intensity of the wave three-dimensionally and FIG. 10(*b*) shows an intensity of the wave along the lines a-a' and b-b' of FIG. 9 where the intensity of the wave is concentrated.

Figure 11:
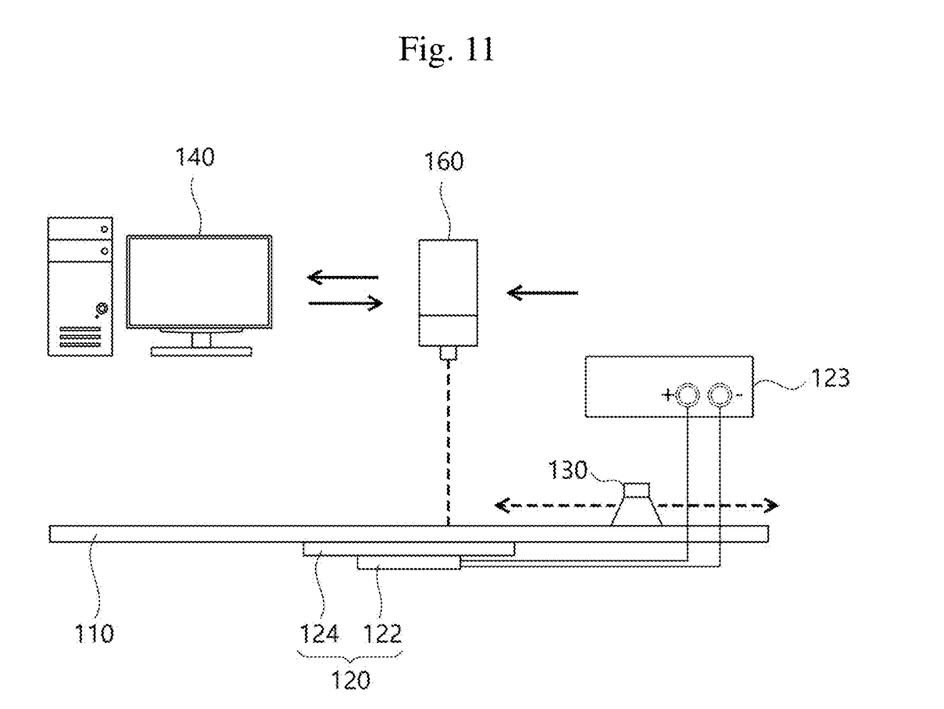
FIG. 11 shows a setup for experiments of the wave control apparatus according to an embodiment of the present invention.

FIG. 11 shows a setup for experiments of the wave control apparatus according to an embodiment of the present invention.

Referring to FIG. 11, a copper plate 124 is heated by means of a Peltier heater 122 so as to form the wave modulation region 150. That is, the copper plate 124 is cut to be shaped as the wave modulation region 150 and after the copper plate is attached to the bottom of Nylon 6 plate, the copper plate 124 is heated by the Peltier heater 122 such that the wave modulation region 150 is formed on the Nylon 6 plate. It is configured that temperature of the Peltier heater 122 is able to be controlled by outer electric power from a power supply 123 and the copper plate 124 is able to be heated up to 100° C. for about 20 minutes. By such arrangement, the power supply 123, the copper plate 124 and the Peltier heater 122 constitute the heating unit 120.

PSV-500 scanning vibrometer 160 is used to analyze acoustic pressure and velocity of an ultrasonic wave propagating on the surface of Nylon 6 plate. The vibrometer 160 uses laser to detect vibrations at a specific point on the plane and synthesizes many point data to form acoustic pressure field on the scanned region. The wave source 130 generates a circular ultrasonic wave having 40 kHz.

Figure 12:
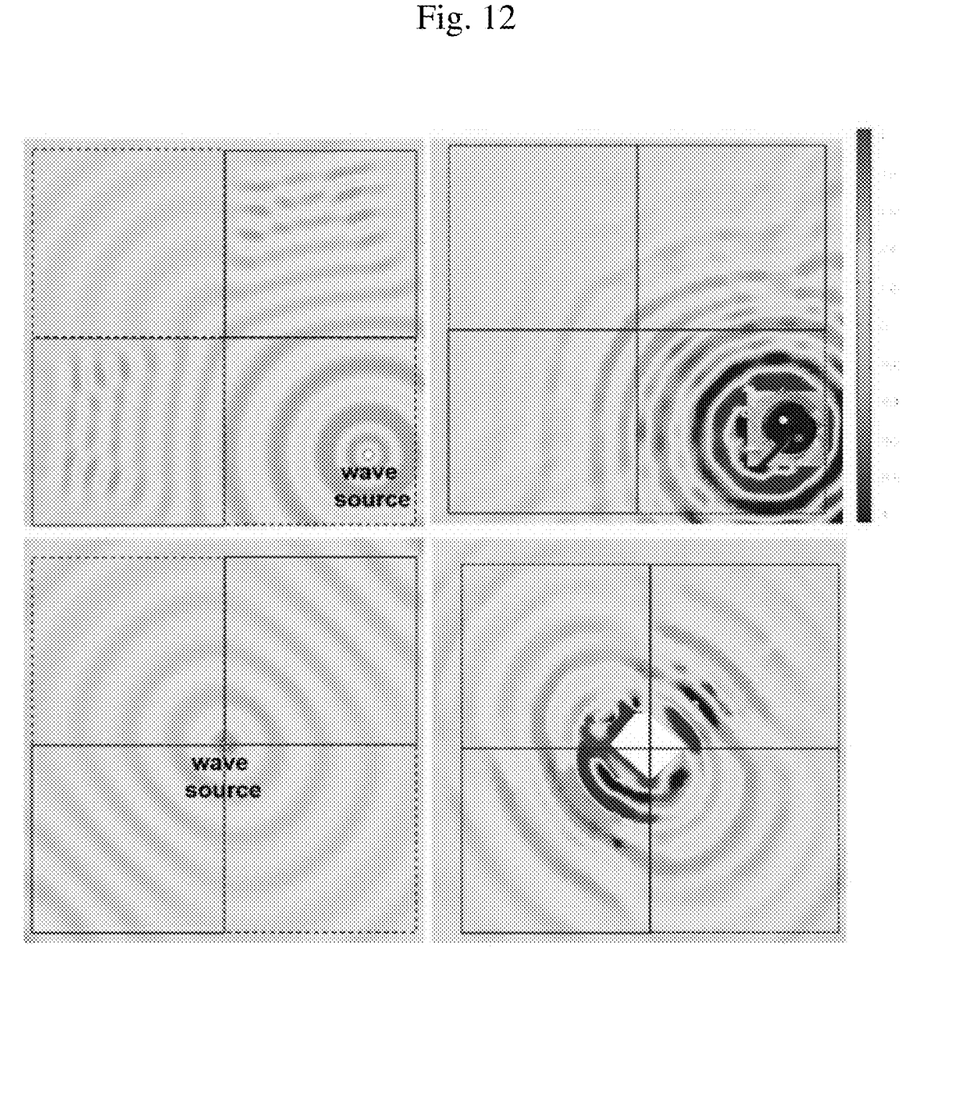
FIG. 12 shows experimental results using the setup of FIG. 11.

FIG. 12 shows experimental results using the setup of FIG. 11.

A left-top and left-bottom in FIG. 12 show results of simulation of the ultrasonic wave propagating from the wave source 130. A right-top and right-bottom in FIG. 12 show experimental results using the setup of FIG. 11. Referring to FIG. 12, the first quadrant and the third quadrant (square defined by red-colored line) denote a heated wave modulation region and the region is heated up to 90° C. in this experiment. Two experiments on the top in FIG. 12 are results made when the wave source 130 is located in the fourth quadrant and two experiments on the bottom in FIG. 12 are results made when the wave source 130 is located in the center.

The simulation and the experiment result based on the setup show similar wave modulations and accordingly, it can be seen that the wave control apparatus 100 according to the present invention is able to change wave characteristics.

In the embodiments described above, thermoresponsive polymer is used as thermoresponsive materials. However, it should be noted that the thermoresponsive materials is not limited thereto and other material whose elastic modulus is changed according to temperature such as metal can be used. Also, in the above description, Nylon 6 was used for thermoresponsive polymer, but Polyethylene (PE), Polyethylene terephthalate (PET), Polytetrafluoroethylene (PTFE), Isotactic polypropylene (PP) can be also used.

Further, in the above embodiments, ultrasonic wave was used for the wave, but other wave passing through a solid surface such as surface wave or seismic wave can be used.

It is understood by those skilled in the art that the foregoing description is a preferred embodiment of the invention but the scope of the invention is not limited to the preferred embodiment, and that various changes and modifications based on the basic concept of the invention defined by the claims are also within the scope of the invention.

REFERENCE NUMBER

100: wave control apparatus
110: wave modulation member
120: heating unit
121: unit heating cell
130: wave source
140: wave control unit
150: wave modulation region

The invention claimed is:

1. A wave control apparatus using change of elastic modulus of thermoresponsive material, comprising:
    a wave modulation member having thermoresponsive material whose elastic modulus changes according to temperature variation,
    a wave source propagating a wave through the wave modulation member, and
    a heating unit forming a wave modulation region by heating the wave modulation member;
    wherein the wave propagating through the wave modulation member from the wave source is configured to change wave characteristics when the wave passes through the wave modulation region heated by the heating unit,
    wherein the heating unit is configured to form the wave modulation region by selectively heating a portion of the wave modulation member and to change the wave characteristics by changing a geometric shape of the wave modulation region, and
    wherein the heating unit has a plate shape which is formed along a plate surface of the wave modulation member; the heating unit having a plate shape consists of a plurality of unit heating cells which are heated respectively; and the wave control apparatus further comprises a wave control unit which controls the heating unit such that at least one of the plurality of unit heating cells is selectively heated and the unit heating cells which are selectively heated form the wave modulation region.

2. The wave control apparatus according to claim 1, wherein the wave comprises a wave which is able to pass through a solid surface of solid.

3. The wave control apparatus according to claim 2, wherein the wave comprises any one of ultrasonic wave, surface wave and seismic wave.

4. The wave control apparatus according to claim 1, wherein the thermoresponsive material comprises thermoresponsive polymer.

5. The wave control apparatus according to claim 4, wherein the thermoresponsive polymer comprises any one of Nylon, Polyethylene (PE), Polyethylene terephthalate (PET), Polytetrafluoroethylene (PTFE), and Isotactic polypropylene (PP).

6. The wave control apparatus according to claim 1, wherein the unit heating cells have any one of a square shape, a right-angled triangle shape and a honeycomb shape.

7. The wave control apparatus according to claim 1, wherein the wave control unit is configured to selectively heat at least one of the plurality of unit heating cells to control geometric shape of the wave modulation region, thereby changing characteristics of a wave passing through the wave modulation region.

8. The wave control apparatus according to claim 1, wherein the wave modulation region comprises an incidence plane which wave enters and an exit plane from which wave exits, and characteristics of a wave coming out from the exit plane change according to a combination of geometric shapes of the incidence plane and the exit plane.

9. The wave control apparatus according to claim 8, wherein the wave control unit is configured to make the wave source generate a circular wave and to control the heating unit such that the incidence plane forms a V shape or an arc shape towards a traveling direction of the circular wave, thereby changing the circular wave passing through the incident wave into a planar wave.

10. The wave control apparatus according to claim 8, wherein the wave control unit is configured to control the heating unit such that an angle of the exit plane with respect to a traveling direction of a planar wave which is changed by the incidence plane or enters the incidence plane, thereby controlling the traveling direction of the planar wave passing through the exit plane.

11. The wave control apparatus according to claim 8, wherein the wave control unit is configured to control the heating unit such that the exit plane forms a V shape towards a traveling direction of a planar wave which is changed by the incidence plane or enters the incidence plane, thereby bifurcating the planar wave passing through the exit plane in the travelling direction.

12. The wave control apparatus according to claim 8, wherein the wave control unit is configured to control the heating unit such that the wave modulation region has a circular shape, thereby concentrating the planar wave from the wave source on an outside of the exit plane.

13. The wave control apparatus according to claim 1, wherein the wave control unit is configured to control wavelength of the wave passing through the wave modulation region by controlling temperature of the wave modulation region.

14. The wave control apparatus according to claim 1, wherein the wave control unit is configured to control the heating unit such that the wave modulation region is heated up to temperature within a glass transition of the thermoresponsive material or temperature selected within temperature range above the glass transition.

* * * * *